United States Patent
Beall et al.

(10) Patent No.: US 10,254,370 B2
(45) Date of Patent: Apr. 9, 2019

(54) MODIFIED PULSE SEQUENCE FOR MAGNETIC RESONANCE IMAGING USING MRI-VISIBLE MARKERS FOR MOTION CORRECTION

(71) Applicant: THE CLEVELAND CLINIC FOUNDATION, Cleveland, OH (US)

(72) Inventors: Erik B. Beall, Westlake, OH (US); Mark Lowe, Cleveland, OH (US); Michael Phillips, Cleveland, OH (US)

(73) Assignee: THE CLEVELAND CLINIC FOUNDATION, Cleveland, OH (US)

(*) Notice: Subject to any disclaimer, the term of this patent is extended or adjusted under 35 U.S.C. 154(b) by 599 days.

(21) Appl. No.: 14/866,173

(22) Filed: Sep. 25, 2015

(65) Prior Publication Data

US 2016/0091592 A1    Mar. 31, 2016

Related U.S. Application Data

(60) Provisional application No. 62/055,197, filed on Sep. 25, 2014.

(51) Int. Cl.
    *G01R 33/565* (2006.01)
    *G01R 33/36* (2006.01)
    (Continued)

(52) U.S. Cl.
    CPC ....... *G01R 33/56509* (2013.01); *G01R 33/36* (2013.01); *G01R 33/3852* (2013.01);
    (Continued)

(58) Field of Classification Search
    CPC .. G01R 33/565; G01R 33/36; G01R 33/3852; G01R 33/543; G01R 33/4826;
    (Continued)

(56) References Cited

U.S. PATENT DOCUMENTS

| 6,516,213 B1 | 2/2003 | Nevo |
| 2005/0171425 A1 | 8/2005 | Burke |

(Continued)

FOREIGN PATENT DOCUMENTS

| JP | 2000237161 A | 9/2000 |

OTHER PUBLICATIONS

An efficient EPI pulse sequence module for active marker motion correction acquisition for EPI scans Erik B Beall, and Mark J Lowe, Proc. Intl. Soc. Mag. Reson. Med. 20 (2012).*

(Continued)

*Primary Examiner* — G. M. A Hyder
(74) *Attorney, Agent, or Firm* — Tarolli, Sundheim, Covell & Tummino LLP

(57) ABSTRACT

Systems and methods are provided for obtaining a motion-compensated magnetic resonance imaging (MRI) image of a region of interest. An active marker, responsive to a preparation pulse, is placed within the region of interest. The preparation pulse is directed to the region of interest, and then a plurality of projection gradient pulses are provided to the region of interest. Respective signals produced in response to the plurality of projection gradient pulses are recorded, and a location of the active marker is determined from the recorded signals.

16 Claims, 3 Drawing Sheets

(51) Int. Cl.
*G01R 33/385* (2006.01)
*G01R 33/54* (2006.01)
*G01R 33/48* (2006.01)
*G01R 33/28* (2006.01)
*G01R 33/483* (2006.01)
*G01R 33/56* (2006.01)
*G01R 33/561* (2006.01)
*G01R 33/563* (2006.01)

(52) U.S. Cl.
CPC ....... *G01R 33/4826* (2013.01); *G01R 33/543* (2013.01); *G01R 33/28* (2013.01); *G01R 33/4838* (2013.01); *G01R 33/5602* (2013.01); *G01R 33/5616* (2013.01); *G01R 33/56341* (2013.01); *G01R 33/56366* (2013.01)

(58) Field of Classification Search
CPC .............. G01R 33/56341; G01R 33/28; G01R 33/4838; G01R 33/5602; G01R 33/5616; G01R 33/56366
See application file for complete search history.

(56) References Cited

U.S. PATENT DOCUMENTS

| | | |
|---|---|---|
| 2008/0221428 A1 | 9/2008 | Flask et al. |
| 2014/0077811 A1* | 3/2014 | Lin ................... A61B 5/055 324/309 |
| 2014/0171784 A1 | 6/2014 | Ooi et al. |

OTHER PUBLICATIONS

Ackerman, J. L., et al. "Rapid 3D tracking of small RF coils." Proceedings of the 5th annual meeting of SMRM, Montreal, Canada. 1986.

Beall, et al., "An efficient EPI pulse sequence module for active marker motion correction acquisition for EPI scans", Radiology, Proc. Intl. Soc. Mag. Reson. Med. 20 (2012), 1 page.

Derbyshire, John A., et al. "Dynamic scan plane tracking using MR position monitoring." U.S. Pat. No. 5,947,900. Sep. 7, 1999.

Dumoulin, C. L., S. P. Souza, and R. D. Darrow. "Real-time position monitoring of invasive devices using magnetic resonance." Magnetic Resonance in Medicine 29.3 (1993): 411-415.

Elgort, Daniel R., et al. "Real-time catheter tracking and adaptive imaging." Journal of Magnetic Resonance Imaging 18.5 (2003): 621-626.

Flask, Chris, et al. "A method for fast 3D tracking using tuned fiducial markers and a limited projection reconstruction FISP (LPR-FISP) sequence." Journal of Magnetic Resonance Imaging 14.5 (2001): 617-627.

Kartmann, et al., "Simultaneous PET/MR imaging: Automatic attenuation correction of flexible RF coils" Proc. Intl. Soc. Mag. Reson. Med. 21 (2013), 1 page.

Krueger, Sascha, et al. "Fast and accurate automatic registration for MR-guided procedures using active microcoils." Medical Imaging, IEEE Transactions on 26.3 (2007): 385-392.

Ooi, et al., Prospective Motion Correction via Real-Time Active Marker Tracking: An Image Quality Assessment, Proc. Intl. Soc. Mag. Reson. Med. 16 (2008), 1 page.

Ooi, Melvyn B., et al. "Prospective real-time correction for arbitrary head motion using active markers." Magnetic Resonance in Medicine 62.4 (2009): 943-954.

Zhang, Qiang, et al. "Active MR guidance of interventional devices with target-navigation." Magnetic resonance in medicine 44.1 (2000): 56-65.

PCT International Search Report and Written Opinion for PCT/US2015/052319, dated Dec. 21, 2015, pp. 1-15.

* cited by examiner

MODIFIED PULSE SEQUENCE FOR MAGNETIC RESONANCE IMAGING USING MRI-VISIBLE MARKERS FOR MOTION CORRECTION

CROSS-REFERENCE TO RELATED APPLICATION

This application claims the benefit of U.S. Provisional Patent Application No. 62/055,197, filed Sep. 25, 2014 and entitled MODIFIED PULSE SEQUENCE FOR MAGNETIC RESONANCE IMAGING, which is incorporated herein by reference in its entirety.

FIELD OF THE INVENTION

The present invention relates to systems and methodologies for diagnosis of medical conditions, and, in particular, is directed to systems and methods for performing magnetic resonance imaging with a modified pulse sequence.

BACKGROUND OF THE INVENTION

Magnetic resonance imaging (MRI) is a medical imaging technique used in radiology to visualize detailed internal structures. MRI makes use of the property of nuclear magnetic resonance to image nuclei of atoms inside the body. An MRI machine uses a powerful magnetic field to align the magnetization of some atoms in the body, and radio frequency fields to systematically alter the alignment of this magnetization. This causes the nuclei to produce a rotating magnetic field detectable by the scanner, which can be detected and used to construct an image of the scanned area of the body. Strong magnetic field gradients cause nuclei at different locations to rotate at different speeds, and thus three-dimensional spatial information can be obtained by providing gradients in each direction.

SUMMARY OF THE INVENTION

In accordance with an aspect of the present invention, a method is provided for obtaining a magnetic resonance imaging (MRI) image of a region of interest. An active marker, responsive to a preparation pulse, is placed within the region of interest. The preparation pulse is directed to the region of interest, and then a plurality of projection gradient pulses are provided to the region of interest. Respective signals produced in response to the plurality of projection gradient pulses are recorded, and a location of the active marker is determined from the recorded signals.

In accordance with an aspect of the present invention, an imaging system, includes an active marker located with a region of interest and a magnetic resonance imaging (MRI) system configured to image the region of interest. The MRI system includes a set of gradient coils configured to provide designed to provide controllable magnetic gradients along respective orthogonal directions and a radio frequency (RF) system designed to transmit RF pulses and receive return signals representing the region of interest. A pulse sequence control is configured to instruct the RF system to direct a preparation pulse, selected to excite a material associated with the active tracker, to the region of interest and to instruct the set of gradient coils to direct a plurality of projection gradient pulses to the region of interest. A system control is configured to record respective signals produced in response to the plurality of projection gradient pulses and determine a location of the active marker from the recorded signals.

In accordance with yet another aspect of the present invention, a magnetic resonance imaging (MRI) system is configured to image a region of interest. A set of gradient coils is configured to provide designed to provide controllable magnetic gradients along respective orthogonal directions. A radio frequency (RF) system is configured to transmit RF pulses and receive return signals representing a region of interest. A pulse sequence control is configured to instruct the RF system to direct a preparation pulse, selected to excite a material associated with an active tracker, to the region of interest, instruct the set of gradient coils to direct a plurality of projection gradient pulses to the region of interest, and instruct the RF system and the set of gradient coils to perform spatial encoding of the region of interest. A system control is configured to record respective signals produced in response to the plurality of projection gradient pulses and the spatial encoding, determine a location of the active marker from the recorded signals, and correct the spatial encoding according to the determined location of the active marker.

BRIEF DESCRIPTION OF THE DRAWINGS

The foregoing and other features of the present invention will become apparent to those skilled in the art to which the present invention relates upon reading the following description with reference to the accompanying drawings, in which.

DETAILED DESCRIPTION OF THE INVENTION

Body part motion, particularly head motion, in clinical magnetic resonance imaging (MRI) is a significant problem. There are approximately thirty million MRI scans performed yearly in the US alone. A significant portion of scans, between ten and fifteen percent, are significantly motion corrupted. The costs of motion on MRI are significant. Delayed or misdiagnosis of patients leads to significant suffering and morbidity, prolongation of hospital stays, and/or delay in treatment. Cost in terms of resource utilization is also significant. Direct technical costs for producing a fifteen-minute MRI are on the order of one hundred dollars, and can exceed this amount. Patients with significant motion issues can take an hour or more with multiple repeat sequences to produce a diagnostic exam. This represents a significant direct cost as well as significant opportunity cost. The inventors have proposed a method to eliminate motion related artifact on MR images, significantly improving the overall value the MRI as a diagnostic test by lowering costs and improving quality.

The illustrated method to eliminate motion-related artifact utilizes active tracking with microcoils. In one implementation of the proposed method, the technologist will put a small device on the patient's forehead when they are preparing for the MRI scans to allow tracking of the head position in space, essentially following the head motion, and compensation of the resulting image for motion. The device includes at least three spatially separated MRI-visible samples, which can be either water or a non-water substance such as lipids or polyethylene glycol, inside small MRI coils, and locating their position and updating the MRI coordinate system on-the-fly to account for any change in device position and thus, any change in head position. In this implementation the location of each microcoil with respect to the others is rigidly fixed. Further, the pulse sequence of the MRI scan is modified to dramatically increase the efficiency of the active tracking. Specifically, the existing water excitation, non-water saturation, or other preparation pulses are used to excite the active markers used for position tracking, with the projection gradient pulses and associated RF readout acquisition for locating the markers following immediately afterwards. The projection gradient pulses and associated RF readout acquisition can be transmitted before or interleaved with the primary image acquisition section consisting of various spatial encoding gradient pulses and readout acquisition. This proposed method avoids additional RF excitation pulses, increasing signal to noise ratio (SNR) and decreasing the necessary scan time. This allows for efficient in-scan motion tracking of a patient in the MRI scanner for the purpose of compensating the acquisition in real-time and thereby prevents motion from corrupting the scan.

Figure 1:
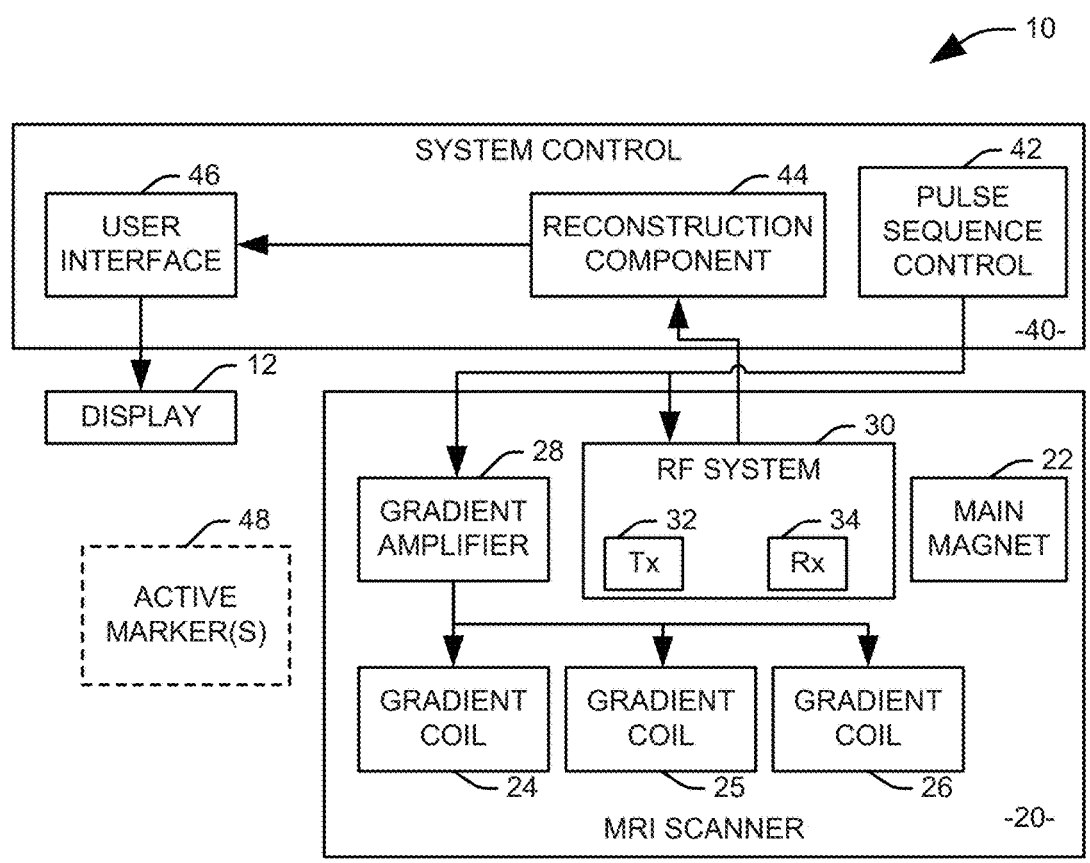
FIG. 1 illustrates an imaging system in accordance with an aspect of the present invention.

FIG. 1 illustrates an imaging system 10 in accordance with an aspect of the present invention. The imaging system 10 includes a display 12, a magnetic resonance imaging (MRI) scanner 20, and a system control 40. The MRI scanner 20 includes a main magnet 22, three orthogonal gradient coils 24-26, and a radio frequency (RF) system 30. The main magnet 22 is designed to provide a constant, homogeneous magnetic field. The orthogonal gradient coils 24-26 are designed to provide three orthogonal, controllable magnetic gradients used to acquire image data of a desired slice by generating an encoded and slice-selective magnetic field. To this end, the gradient coils 24-26 are arranged to establish a gradient field for implementing MRI imaging based on the current provided by the gradient amplifier 28. The gradient coils 24-26 can be formed of a set of gradient coils along transverse axes, referred to herein as the readout axis, the phase encoding axis, and the slice selection axis. The field produced along each axis can be controlled via current applied to each gradient coil 24-26 by the gradient amplifier 28.

The RF system 30 can include an RF transmit coil 32 and an RF receive coil 34 designed to transmit RF pulses and receive return signals representing a region of interest. It will be appreciated, however, that an integrated transceiver coil (not shown) can be used in place of transmit coil 32 and receive coil 34. The RF system 30 can generate an oscillating magnetic field via application of RF current to the RF transmit coil 32. The RF transmit coil 32, for example, can apply RF pulses to the region of interest according to the applied electrical current. The RF receive coil 34 can convert a precessing magnetism at the region of interest to electrical signals, which are provided to the system control 40.

The system control 40 can be implemented as dedicated hardware, software stored on a non-transitory computer readable medium and executed by a general purpose processor, or a combination of both. The system control 40 includes a pulse sequence control 42 that is configured to control the gradient coils 24-26 and the RF system 30. For example, the pulse sequence control 42 can provide control signals to a gradient amplifier 28 that supplies variable current to each of the orthogonal gradient coils 24-26 as well as the current supplied to the RF transmit coil 32. The system control 40 further comprises an image reconstruction component 44 that is configured to construct an image based on the return signals acquired from the RF system 30. Each of the constructed image and the return signals from which it was constructed can be stored at the system control 40 and provided to the display 12 through a user interface 46.

In accordance with an aspect of the present invention, the pulse sequence control 42 can be configured to provide a pulse-sequence that utilizes a preparation or excitation pulse to excite material within one or more active markers 48 within the region of interest, in addition to its ordinary function. The phrase "preparation pulse" is used broadly herein to include both standard preparation pulses, such as inversion preparation and magnetization preparation, and excitation pulses. The proposed pulse sequence method utilizes the series of projection gradient pulses in the period immediately after a volumetric-selective or non-selective preparation pulse. In accordance with an aspect of the present invention, no additional excitation is required for location of the active tracker, and in most cases, specifically those sequences with dead time after the preparation or excitation pulse, no additional acquisition time is necessary. In addition, the specific absorption rate (SAR), or heating of the patient, will not be increased. Once the active markers 48 have been located, the pulse sequence control 42 can instruct the RF system 30 and the set of gradient coils 24-26 to perform spatial encoding of the region of interest, and the system control 40 can correct the spatial encoding according to the determined location of the active marker.

The active markers 48 can be formed from or contain a material responsive to the preparation pulse, such that the position of the marker can be ascertained by a plurality of projection gradient pulses provided to the region of interest. For example, the active markers can be filled with water or a lipid, or formed from an MRI reactive material. The determined position of the active markers can be used to correct for motion of a patient or subject during the MRI scanning, increasing the quality of the resulting MRI image.

In accordance with an aspect of the present invention, one implementation of the active markers 48 can include small magnetically resonant RF coils containing a different chemical species than water. The inventors have determined the shift due to off-resonance problems in not-water materials is constant and thus does not prevent accurate motion tracking. Specifically, the shift can be measured and subtracted or ignored. Accordingly, active tracking with lipids or other non-water when using a non-water preparation pulse can increase signal-to-noise ratio in the microcoils during the projection readouts because the water excitation does not affect the non-water species as strongly. With a greater signal-to-noise ratio, the accuracy of the fitted positions of each microcoil is improved, improving the position and orientation tracking.

In another implementation, active trackers can be printed from MRI-visible material via an appropriate rapid prototyping technology, such as three-dimensional (3-D) printing. MRI-visible material is often required in various geometries for various purposes. For example, when doing position tracking with active microcoils, the inventors have found a spherical MRI-visible sample to be useful. However, the inventors found existing methods for producing the spherical sample to be unsatisfactory, as sealing the sample is difficult to accomplish without introducing air bubbles or deviations from the desired geometry. To this end, in order to create a 3-D part that has internal cavities or freestanding structures, the inventors have used a MRI-visible support material in addition to a model material, with the support material being water soluble or otherwise readily removable. It will be appreciated that the model material can be formed to substantially encapsulate the support material, and the support material dissolved or otherwise removed to provide hollow structures.

The inventors have discovered an appropriate, MRI-visible support material that is compatible with rapid prototyping technologies, and use the support material as the MRI-visible material of interest. The proposed assembly avoids problems associated with sealing the cavity, and the model material produces no MRI signal yet contains the support material in a very stable and useful manner. Furthermore, the material used to-date has desirable short-T1 properties, although these could be tuned in future applications. The methods for generating this assembly are generally applicable to a number of tasks in magnetic resonance imaging. For example, to provide an MRI-visible sample of blood vessels in tissue absent the inventors' discovery, the typical strategy would be to print hollow vessel walls, which would be very problematic to remove support material from prior to filling the sample with an MRI-visible solution such as water. Using the inventors' methodology, it is possible to avoid the vessel cleaning stage and ensure the ends of vessels were sealed with model material. This would produce a highly stable phantom suitable for evaluating MRI protocols sensitivity to known geometries. The inventors have explored the use of this method for producing MRI visible bile ducts inside printed liver samples.

Figure 2:
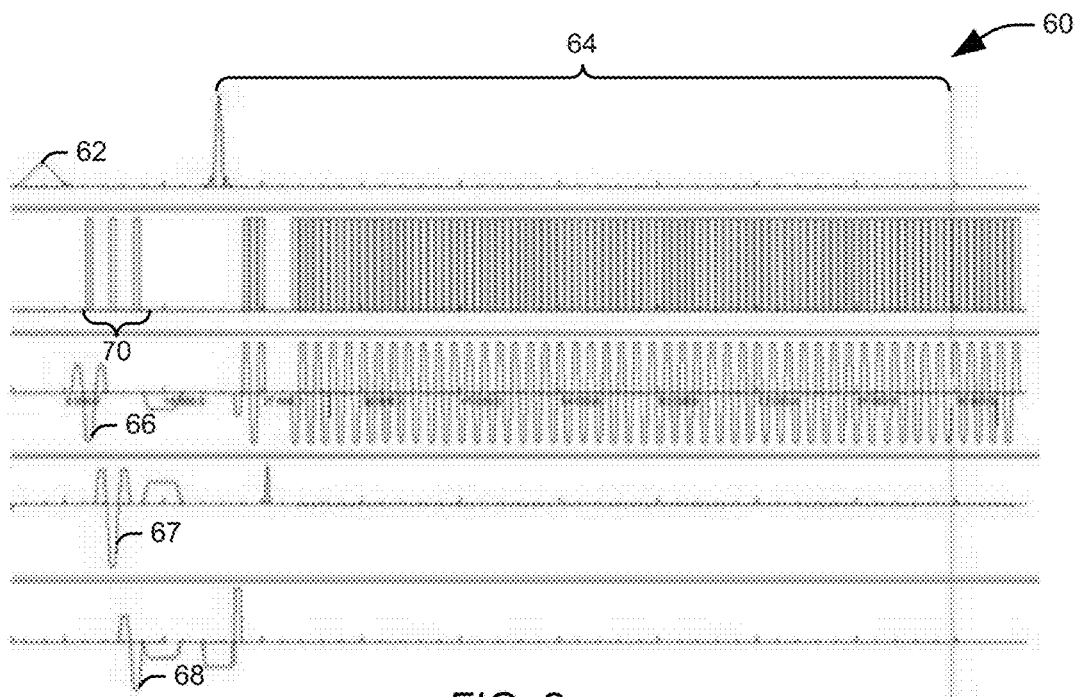
FIG. 2 illustrates one example of a pulse sequence that can be used with the system of FIG. 1.

FIG. 2 illustrates one example of a pulse sequence 60 that can be used with the system of FIG. 1. Specifically, the illustrated pulse sequence 60 for magnetic resonance imaging (MRI) can be used to perform position tracking with projection localization of multiple microcoils, that is, small MRI receive coils, fixed with respect to each other, but allowed to move with the body part under examination. The illustrated pulse sequence 60 represents an example of echo-planar imaging (EPI), which is used for functional neuroimaging, perfusion imaging and diffusion weighted imaging of the brain. This method can also be applied to multi-shot sequences. In this pulse sequence 60, a fat saturation RF pulse 62 is used to selectively excite fat, which is then dephased before performing standard water excitation and spatial encoding in an EPI pulse sequence 64.

An MRI-visible sample may be made of water or fat or other chemical species that can be excited by the MRI RF transmitter and pulse sequence. This method works with various MRI-visible chemicals as the MRI sample in the microcoils. For example, typical fat saturation methods excite only a small amount of water, but this is sufficient to perform microcoil projection localization when using water as the sample of interest. Using lipids when performing projections after fat saturation provide higher SNR. The full pulse sequence module is comprised of three projection gradients 66-68 performed sequentially in orthogonal directions, with microcoil voltage sampling 70 switched on during each projection gradient. The data produced by the three or more microcoils can be used to accurately localize position and rotation of the ensemble and thus update the MRI acquisition system during the scan to remove the effect of motion from the imaging sequence. In another implementation of this method, the projection gradients are reversed to acquire a second, inverted positioning echo that can be averaged with the first to produce an improved estimate of the location of the sample, thus requiring six projection gradient readouts.

The rapid position acquisition provided by this pulse sequence and the associated active markers allow the system to avoid retrospective motion compensation, which require that part of the scan be completed. That portion, or repetition of the scan is then motion-corrupted, and in the typical case of imaging with repetition times less than several multiples of the T1 of the underlying tissue, the following few repetitions are also corrupted due to spin-history equilibration effects. Spin history effects cannot be compensated for after the fact, and the inventors have avoided them by performing motion detection and compensation immediately prior to the slice- or slab-selective imaging. Accordingly, the illustrated pulse sequence allows for a significant increase in accuracy of motion tracking and correction in an MRI system.

Figure 3:
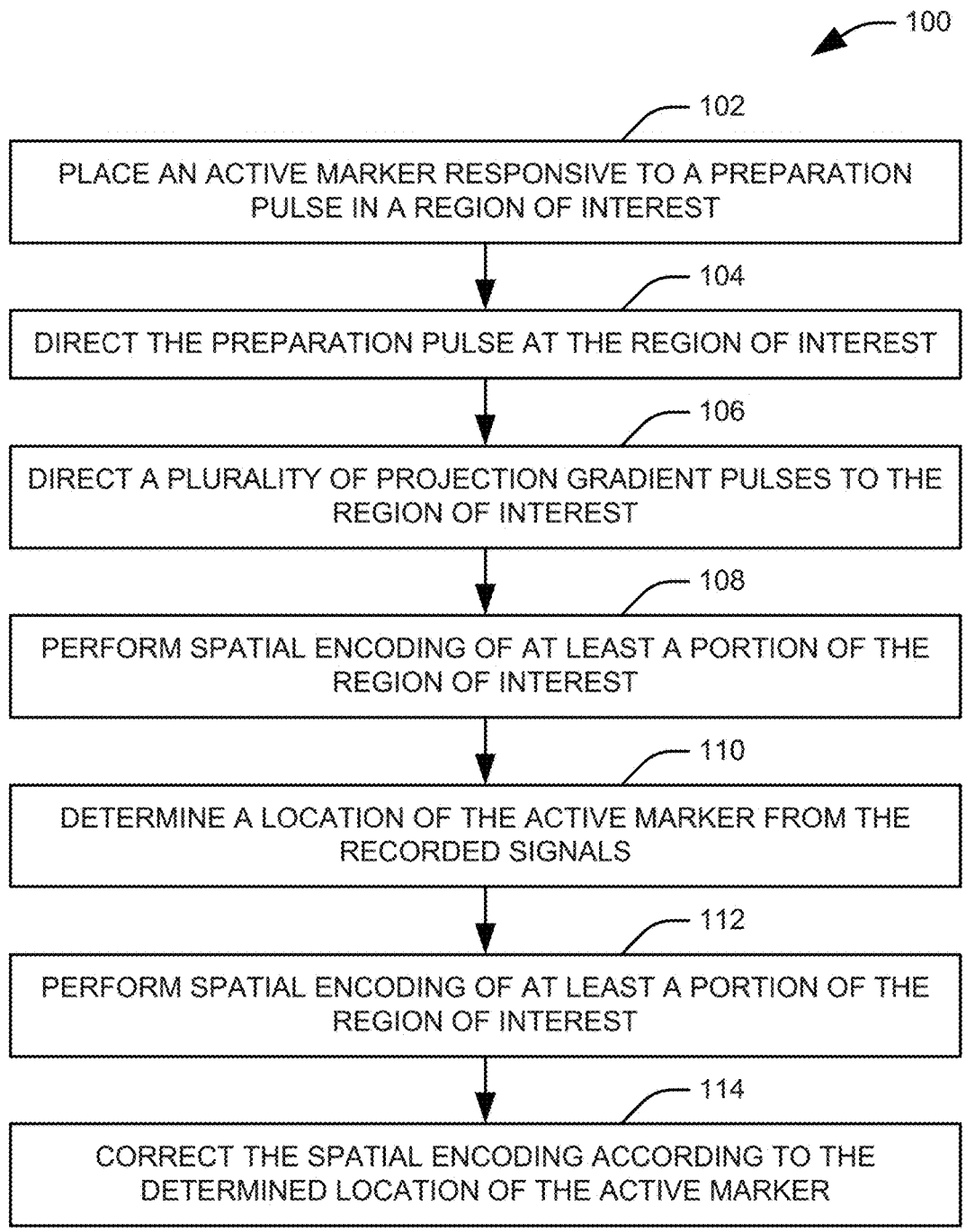
FIG. 3 illustrates one example of a method for obtaining a magnetic resonance imaging (MRI) image of a region of interest in accordance with an aspect of the present invention.

FIG. 3 illustrates one example of a method 100 for obtaining a magnetic resonance imaging (MRI) image of a region of interest in accordance with an aspect of the present invention. At 102, an active marker, responsive to a preparation pulse, is placed within the region of interest. For example, the active marker can include one or more microcoils filled with water, lipids, or another MRI-reactive material. At 104, the preparation pulse is directed to the region of interest to excite the active marker. In one implementation, the preparation pulse is a fat saturation pulse. At 106, a plurality of projection gradient pulses are directed to the region of interest while the active marker is excited, and respective signals produced in response to the plurality of projection gradient pulses are recorded at 108.

At 110, a location of the active marker is determined from the recorded signals. At 112, spatial encoding of at least a portion of the region of interest is performed. It will be appreciated that, in accordance with an aspect of the present invention, the plurality of projection gradient pulses are directed to the region of interest at 106 between the direction of the preparation pulse to the region of interest at 104 and the spatial encoding of the region of interest at 112. The spatial encoding is corrected according to the determined location of the active marker at 114. It will be appreciated that this sequence can be repeated until a desired portion of the region of interest has been spatially encoded. In one implementation, this includes correcting the water excitation region according to the determined location of the active marker.

Figure 4:
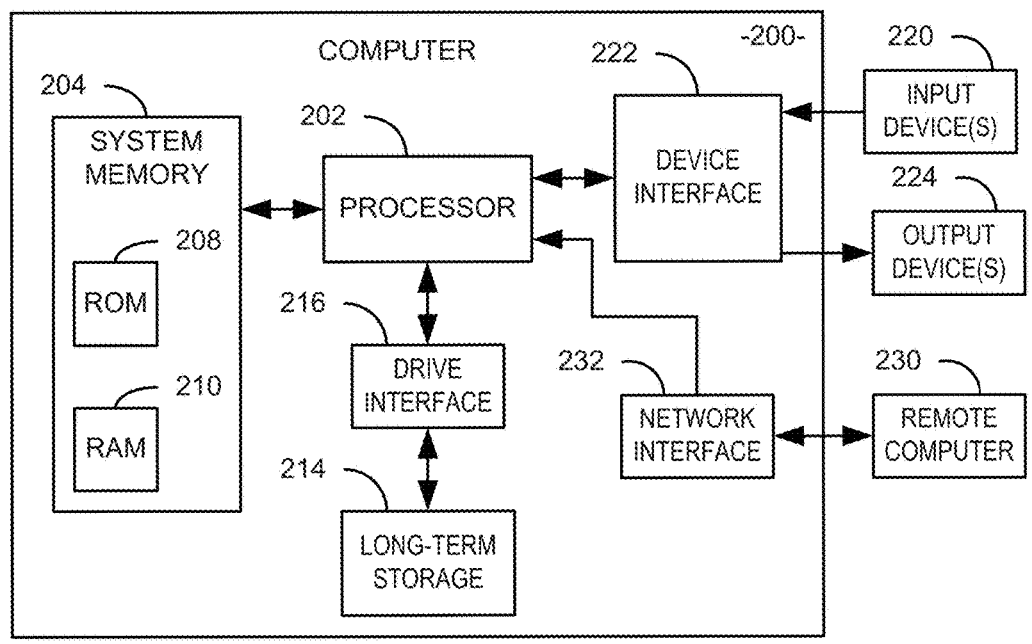
FIG. 4 illustrates a computer system that can be employed to implement systems and methods described herein, such as systems and methods based on computer executable instructions running on the computer system.

FIG. 4 illustrates a computer system 200 that can be employed to implement systems and methods described herein, such as based on computer executable instructions running on the computer system. The computer system 200 can be implemented on one or more general purpose networked computer systems, embedded computer systems, routers, switches, server devices, client devices, various intermediate devices/nodes and/or stand alone computer systems. In one implementation, the computer system 200 can be implemented as part of a medical system or device running computer executable instructions to perform a method as described herein.

The computer system 200 includes a processor 202 and a system memory 204. Dual microprocessors and other multi-processor architectures can also be utilized as the processor 202. The processor 202 and system memory 204 can be coupled by any of several types of bus structures, including a memory bus or memory controller, a peripheral bus, and a local bus using any of a variety of bus architectures. The system memory 204 includes read only memory (ROM) 208 and random access memory (RAM) 210. A basic input/output system (BIOS) can reside in the ROM 208, generally containing the basic routines that help to transfer information between elements within the computer system 200, such as a reset or power-up.

The computer system 200 can include one or more types of long-term data storage 214, including a hard disk drive, a magnetic disk drive, (e.g., to read from or write to a removable disk), and an optical disk drive, (e.g., for reading a CD-ROM or DVD disk or to read from or write to other optical media). The long-term data storage can be connected to the processor 202 by a drive interface 216. The long-term storage components 214 provide nonvolatile storage of data, data structures, and computer-executable instructions for the computer system 200. A number of program modules may also be stored in one or more of the drives as well as in the RAM 210, including an operating system, one or more application programs, other program modules, and program data.

A user may enter commands and information into the computer system 200 through one or more input devices 220, such as a keyboard, a touchscreen, and/or a pointing device (e.g., a mouse). It will be appreciated that the one or more input devices 220 can include one or more sensor assemblies transmitting acceleration data to the computer 200 for further processing. These and other input devices are often connected to the processor 202 through a device interface 222. For example, the input devices can be connected to the system bus by one or more a parallel port, a serial port or a USB. One or more output device(s) 224, such as a visual display device or printer, can also be connected to the processor 202 via the device interface 222.

The computer system 200 may operate in a networked environment using logical connections (e.g., a local area network (LAN) or wide area network (WAN)) to one or more remote computers 230. A given remote computer 230 may be a workstation, a computer system, a router, a peer device, or other common network node, and typically includes many or all of the elements described relative to the computer system 200. The computer system 200 can communicate with the remote computers 230 via a network interface 232, such as a wired or wireless network interface card or modem. In a networked environment, application programs and program data depicted relative to the computer system 200, or portions thereof, may be stored in memory associated with the remote computers 230.

It will be understood that the above description of the present invention is susceptible to various modifications, changes and adaptations, and the same are intended to be comprehended within the meaning and range of equivalents of the appended claims. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

Having described the invention, the following is claimed:

1. A method for obtaining a magnetic resonance imaging (MRI) image of a region of interest, comprising:
    placing an active marker, responsive to a preparation pulse, within the region of interest;
    directing the preparation pulse to the region of interest;
    directing a first plurality of projection gradient pulses to the region of interest;
    recording a first set of respective signals produced in response to the first plurality of projection gradient pulses;
    directing a second plurality of projection gradient pulses to the region of interest, the second plurality of projection gradient pulses being reversed relative to the first plurality of projection gradient pulse;
    recording a second set of respective signals produced in response to the second plurality of projection gradient pulses;
    averaging the first set of respective signals and the second set of respective signals to provide a set of averaged signals; and
    determining a location of the active marker from the set of averaged signals.

2. The method of claim 1, wherein the preparation pulse is a fat saturation pulse.

3. The method of claim 1, wherein the preparation pulse is a water excitation pulse.

4. The method of claim 1, wherein the preparation pulse is a magnetization preparation pulse.

5. The method of claim 1, further comprising performing spatial encoding of the region of interest, wherein the plurality of projection gradient pulses are directed to the region of interest after the direction of the preparation pulse to the region of interest and before the spatial encoding of the region of interest.

6. The method of claim 5, wherein the preparation pulse is a fat excitation pulse, and the method further comprises directing a water excitation pulse to the region of interest immediately before the spatial encoding of the region of interest.

7. The method of claim 1, further comprising:
    performing spatial encoding of the region of interest; and
    correcting the spatial encoding according to the determined location of the active marker.

8. The method of claim 7, wherein correcting the spatial encoding comprises correcting a water excitation region according to the determined location of the active marker.

9. An imaging system, comprising:
    an active marker fabricated from an MRI-visible material and located with a region of interest, the active marker is fabricated by printing model material onto an MRI-visible water-soluble support material such that the support material is substantially encapsulated by the model material; and
    a magnetic resonance imaging (MRI) system configured to image the region of interest, the MRI system comprising:
        a set of gradient coils configured to provide controllable magnetic gradients along respective orthogonal directions;
        a radio frequency (RF) system configured to transmit RF pulses and receive return signals representing the region of interest; and
        a pulse sequence control configured to instruct the RF system to direct a preparation pulse, selected to excite a material associated with the active tracker, to the region of interest and to instruct the set of gradient coils to direct a plurality of projection gradient pulses to the region of interest;
        a system control configured to record respective signals produced in response to the plurality of projection gradient pulses and determine a location of the active marker from the recorded signals.

10. The imaging system of claim 9, wherein the material associated with the active marker is water.

11. The imaging system of claim 9, wherein the material associated with the active marker is a lipid.

12. The imaging system of claim 9, the pulse sequence control being configured to instruct the RF system and the set of gradient coils to perform spatial encoding of the region of interest and the system control being configured to correct the spatial encoding according to the determined location of the active marker.

13. The imaging system of claim 12, wherein the pulse sequence control is configured to instruct the RF system and the set of gradient coils to perform a pulse sequence such that the RF system provides the preparation pulse and samples the respective signals during the plurality of projection gradient pulses, and then perform spatial encoding of the region of interest after the plurality of projection gradient pulses.

14. The imaging system of claim 13, wherein the pulse sequence control is configured to instruct the RF system to provide a second preparation pulse between a first of the plurality of projection gradient pulses and the spatial encoding.

15. A method for obtaining a magnetic resonance imaging (MRI) image of a region of interest, comprising:
- fabricating an active marker from an MRI-visible model material via a rapid prototyping technology
- placing the active marker, responsive to a preparation pulse, within the region of interest;
- directing the preparation pulse to the region of interest;
- directing a plurality of projection gradient pulses to the region of interest;
- recording respective signals produced in response to the plurality of projection gradient pulses; and
- determining a location of the active marker from the recorded signals.

16. The method of claim 15, wherein fabricating the active marker via a rapid prototyping technology comprises printing the model material, via a three-dimensional printing process, onto an MRI-visible water-soluble support material such that the support material is substantially encapsulated by the model material.

* * * * *